US012588476B2

(12) United States Patent
Lin

(10) Patent No.: US 12,588,476 B2
(45) Date of Patent: Mar. 24, 2026

(54) SEMICONDUCTOR MEMORY DEVICE MANUFACTURING METHOD

(71) Applicant: NANYA TECHNOLOGY CORPORATION, New Taipei City (TW)

(72) Inventor: Chih-Ching Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 271 days.

(21) Appl. No.: 18/582,082

(22) Filed: Feb. 20, 2024

(65) Prior Publication Data

US 2025/0266258 A1     Aug. 21, 2025

(51) Int. Cl.
*H01L 21/033* (2006.01)
*H01L 21/311* (2006.01)
*H01L 21/768* (2006.01)

(52) U.S. Cl.
CPC .... *H01L 21/0332* (2013.01); *H01L 21/31144* (2013.01); *H01L 21/76877* (2013.01)

(58) Field of Classification Search
CPC ........... H01L 21/0332; H01L 21/31144; H01L 21/76877; H01L 21/76838; H01L 21/76895
USPC ................................................. 438/689–714
See application file for complete search history.

(56) References Cited

U.S. PATENT DOCUMENTS

| | | | | |
|---|---|---|---|---|
| 6,258,649 B1* | 7/2001 | Nakamura | ............. | H10B 12/09 |
| | | | | 257/E21.585 |
| 6,451,708 B1* | 9/2002 | Ha | ......................... | H10B 99/22 |
| | | | | 257/E21.252 |
| 2005/0106887 A1* | 5/2005 | Chen | ................. | H01L 21/76816 |
| | | | | 257/E21.577 |
| 2012/0205779 A1* | 8/2012 | Kim | ....................... | H10D 1/692 |
| | | | | 257/532 |

FOREIGN PATENT DOCUMENTS

JP          2012054454 A  *  3/2012

* cited by examiner

*Primary Examiner* — Duy Vu N Deo
(74) *Attorney, Agent, or Firm* — CKC & Partners Co., LLC

(57) ABSTRACT

A semiconductor memory device manufacturing method includes the following steps. A bit line structure is formed in a memory array area of a substrate. A gate structure is formed in a periphery area of the substrate. A dielectric layer is formed over the bit line structure and the gate structure. A lower hard mask layer is formed over the dielectric layer. An etch process diagnostic signal layer is formed over the lower hard mask layer. An upper hard mask layer is formed over the etch process diagnostic signal layer. A main etching step is performed to form a first via hole towards the bit line structure and a second via hole towards the gate structure until the upper hard mask layer is removed to expose the etch process diagnostic signal layer.

20 Claims, 5 Drawing Sheets

100

200

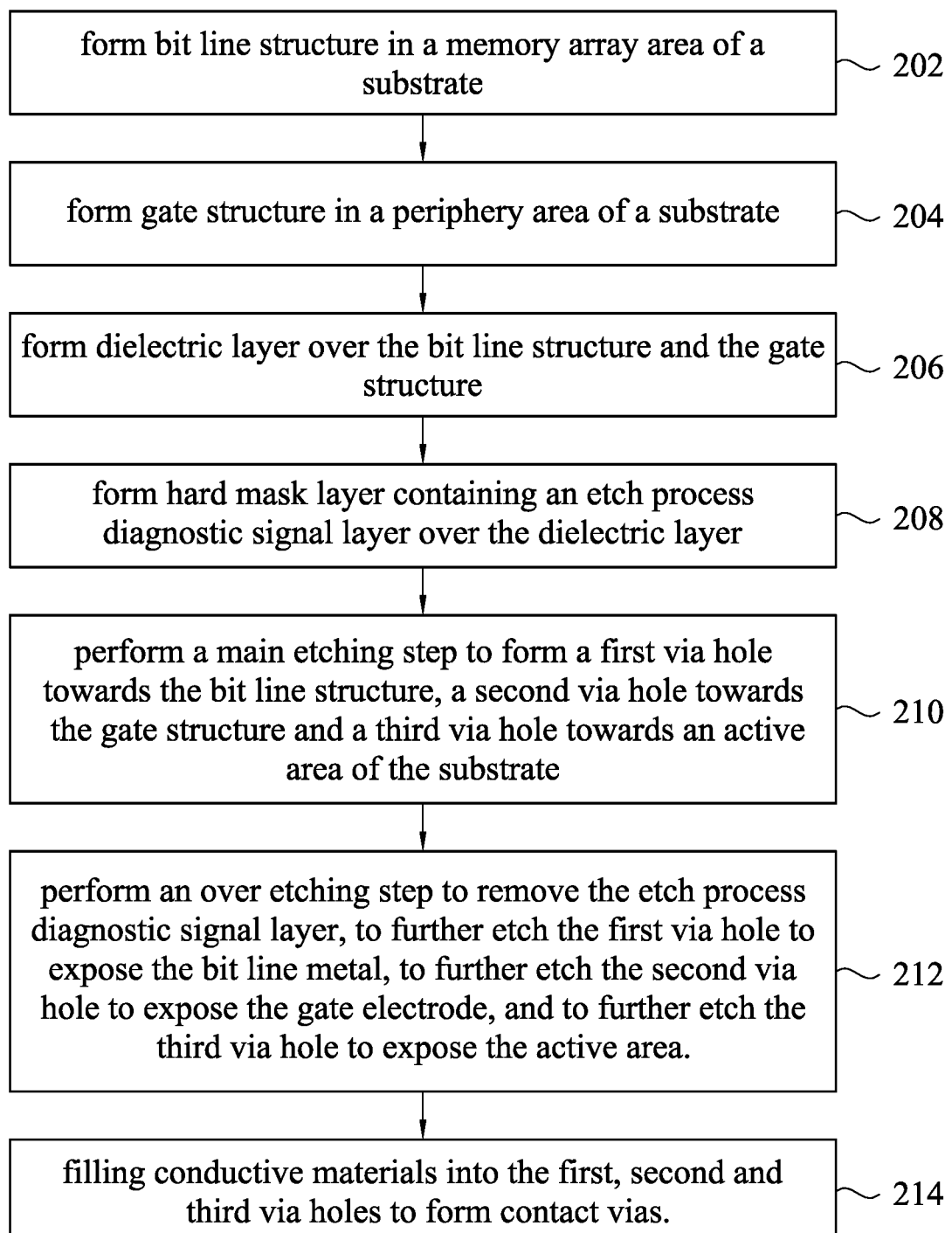

form bit line structure in a memory array area of a substrate ~ 202 form gate structure in a periphery area of a substrate ~ 204 form dielectric layer over the bit line structure and the gate structure ~ 206 form hard mask layer containing an etch process diagnostic signal layer over the dielectric layer ~ 208 perform a main etching step to form a first via hole towards the bit line structure, a second via hole towards the gate structure and a third via hole towards an active area of the substrate ~ 210 perform an over etching step to remove the etch process diagnostic signal layer, to further etch the first via hole to expose the bit line metal, to further etch the second via hole to expose the gate electrode, and to further etch the third via hole to expose the active area. ~ 212 filling conductive materials into the first, second and third via holes to form contact vias. ~ 214

Fig. 5

SEMICONDUCTOR MEMORY DEVICE MANUFACTURING METHOD

BACKGROUND

Field of Disclosure

The present disclosure relates to a semiconductor memory device and manufacturing method thereof.

Description of Related Art

An integrated circuit (IC) device (also referred to as a semiconductor chip) can contain millions of transistors and other circuit elements that are fabricated on a single silicon crystal substrate (wafer). In a semiconductor memory device, contact vias in a memory device refers to the connection points that allow electrical contact between different layers of the device. Contact via holes are openings created in the insulating layers to facilitate these connections. It is difficult to etch the contact via holes to proper depths in different regions of the device.

SUMMARY

The present disclosure provides semiconductor memory device manufacturing methods to deal with the needs of the prior art problems.

In one or more embodiments, a semiconductor memory device manufacturing method including: forming a bit line structure in a memory array area of a substrate, wherein the bit line structure comprises a bit line metal and a bit line mask; forming a gate structure in a periphery area of the substrate, wherein the gate structure comprises a gate electrode and a gate mask; forming a dielectric layer over the bit line structure and the gate structure; forming a lower hard mask layer over the dielectric layer; forming an etch process diagnostic signal layer over the lower hard mask layer; forming an upper hard mask layer over the etch process diagnostic signal layer; and performing a main etching step to form a first via hole towards the bit line structure and a second via hole towards the gate structure until the upper hard mask layer is removed to expose the etch process diagnostic signal layer.

In one or more embodiments, the method further includes: performing an over etching step to remove the etch process diagnostic signal layer, to further etch the first via hole to expose the bit line metal, and to further etch the second via hole to expose the gate electrode.

In one or more embodiments, the main etching step is performed for a first time period and the over etching step is performed for a second time period that is 20%-30% of the first time period.

In one or more embodiments, the etch process diagnostic signal layer, the bit line mask, and the gate mask are all made from the same material.

In one or more embodiments, the etch process diagnostic signal layer, the bit line mask, and the gate mask are all made from silicon nitride.

In one or more embodiments, the bit line mask and the dielectric layer are made from different dielectric materials.

In one or more embodiments, the gate mask and the dielectric layer are made from different dielectric materials.

In one or more embodiments, the lower hard mask layer and the upper hard mask layer are made from carbon-based materials.

In one or more embodiments, the bit line metal is made from tungsten.

In one or more embodiments, the gate electrode is made from tungsten and polysilicon.

In one or more embodiments, a semiconductor memory device manufacturing method including: forming a bit line structure in a memory array area of a substrate, wherein the bit line structure comprises a bit line metal and a bit line mask; forming a plurality of gate structures in a periphery area of the substrate, wherein each gate structure comprises a gate electrode and a gate mask; forming a dielectric layer over the bit line structure and the gate structures; forming a hard mask layer containing an etch process diagnostic signal layer over the dielectric layer; and performing a main etching step to form a first via hole towards the bit line structure, a second via hole towards one of the gate structures and a third via hole towards an active area of the substrate between immediately-adjacent two of the gate structures until the hard mask layer is partially removed to expose the etch process diagnostic signal layer.

In one or more embodiments, the method further including: performing an over etching step to remove the etch process diagnostic signal layer, to further etch the first via hole to expose the bit line metal, to further etch the second via hole to expose the gate electrode, and to further etch the third via hole to expose the active area.

In one or more embodiments, the main etching step is performed for a first time period and the over etching step is performed for a second time period that is 20%-30% of the first time period.

In one or more embodiments, the etch process diagnostic signal layer, the bit line mask, and the gate mask are all made from the same material.

In one or more embodiments, the etch process diagnostic signal layer, the bit line mask, and the gate mask are all made from silicon nitride.

In one or more embodiments, the bit line mask and the gate mask are made from silicon nitride and the dielectric layer is made from silicon oxide.

In one or more embodiments, the hard mask layer is made from carbon-based materials.

In one or more embodiments, the method further includes: filling conductive materials into the first, second and third via holes to form contact vias.

In one or more embodiments, the bit line metal is made from tungsten.

In one or more embodiments, the gate electrode is made from tungsten and polysilicon.

In sum, the semiconductor memory device manufacturing method disclosed herein utilizes EPD signal layer inserted in hard mask layer to get a strong EPD signal to control main etching/over etching of the dielectric layer etch precisely.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5 illustrates a flowchart of several steps of a semiconductor memory manufacturing process according to some embodiments of the present disclosure.

DETAILED DESCRIPTION

Figure 1:
FIGS. 1-4 illustrate cross-sectional views of several steps of a semiconductor memory manufacturing process according to some embodiments of the present disclosure.
Figure 1:
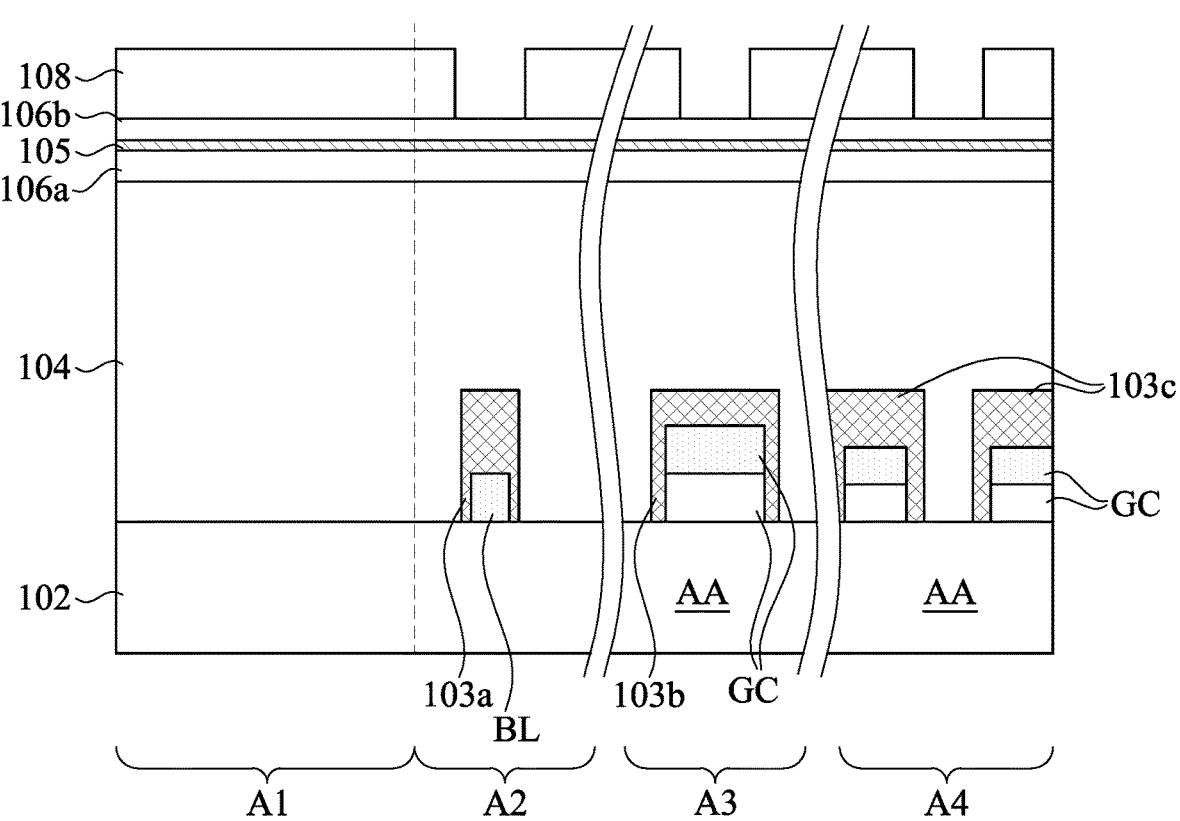
Figure 2:
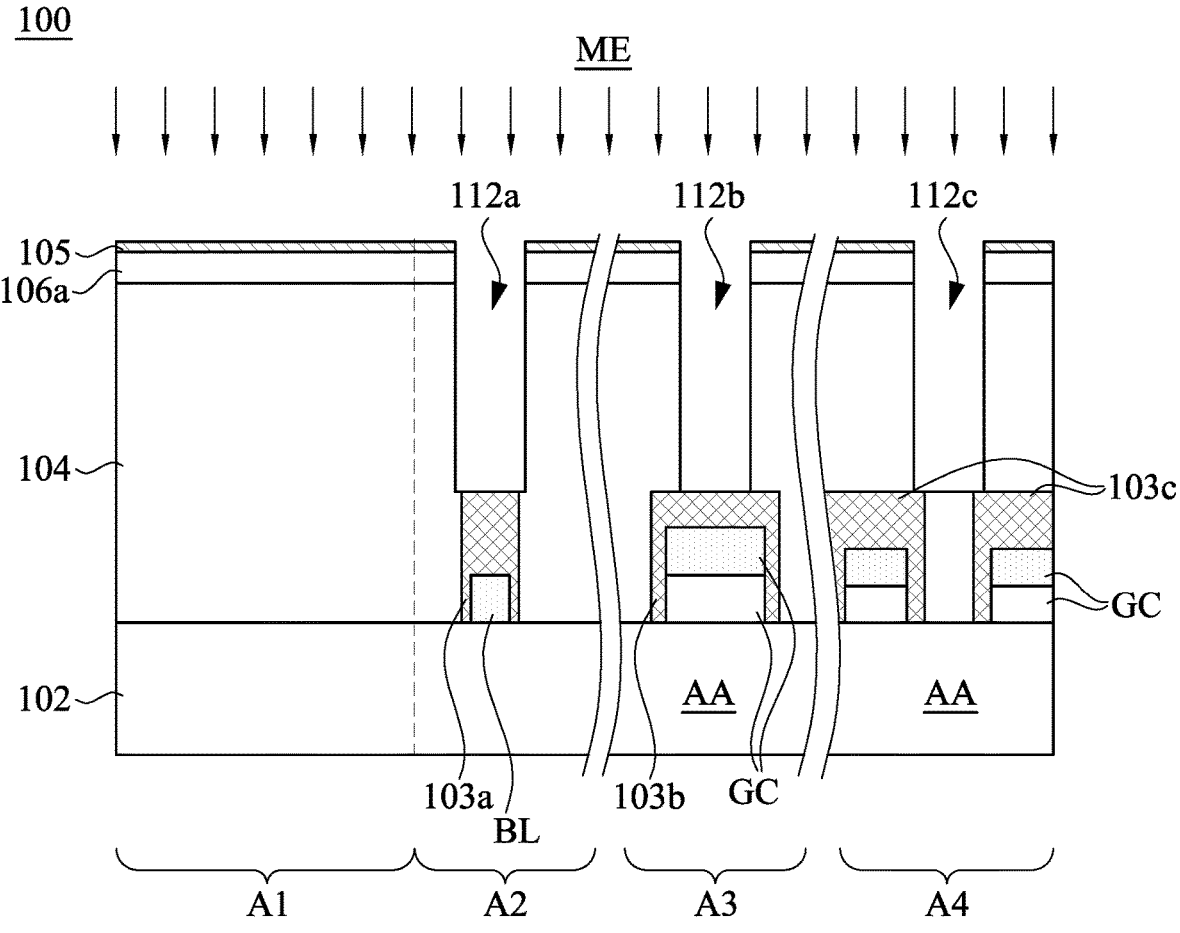
Figure 3:
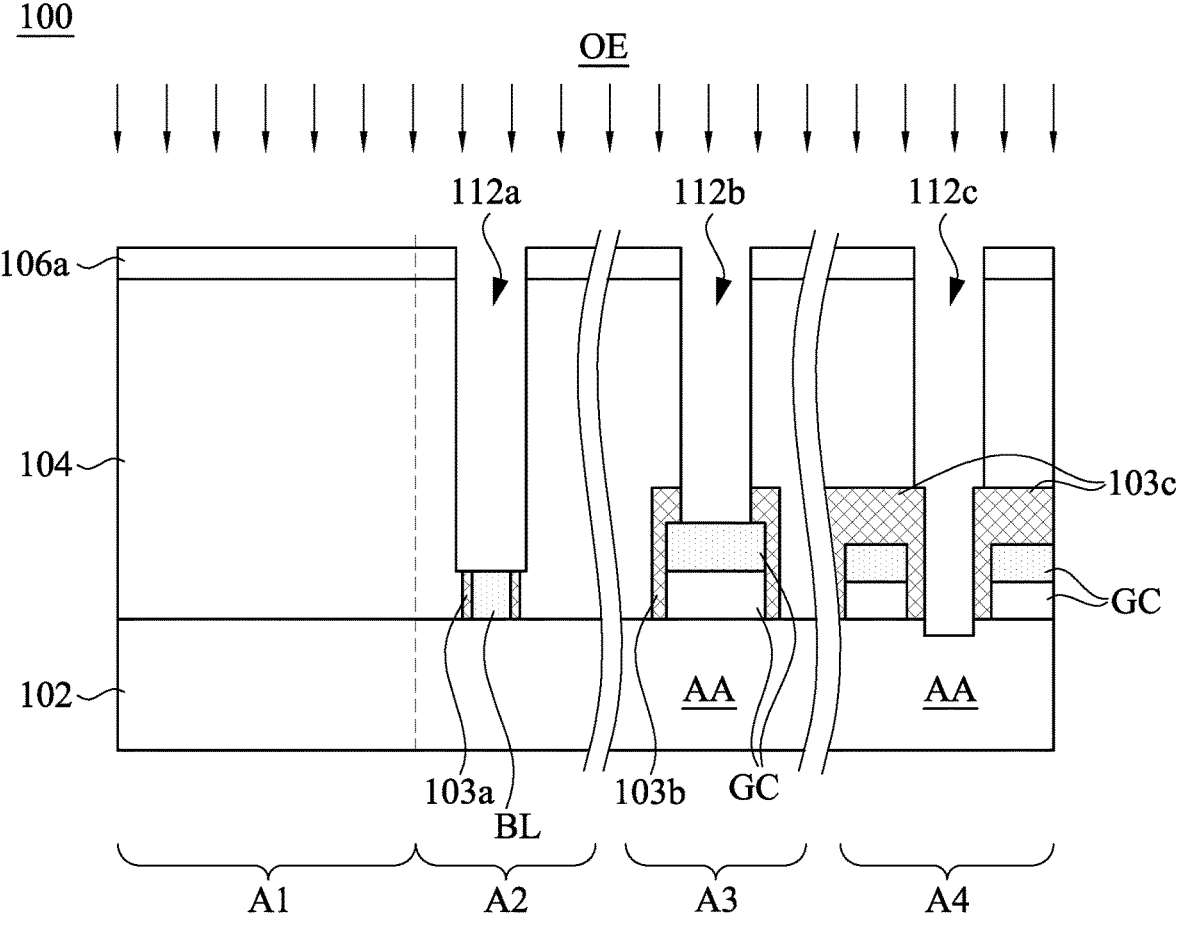
Figure 4:
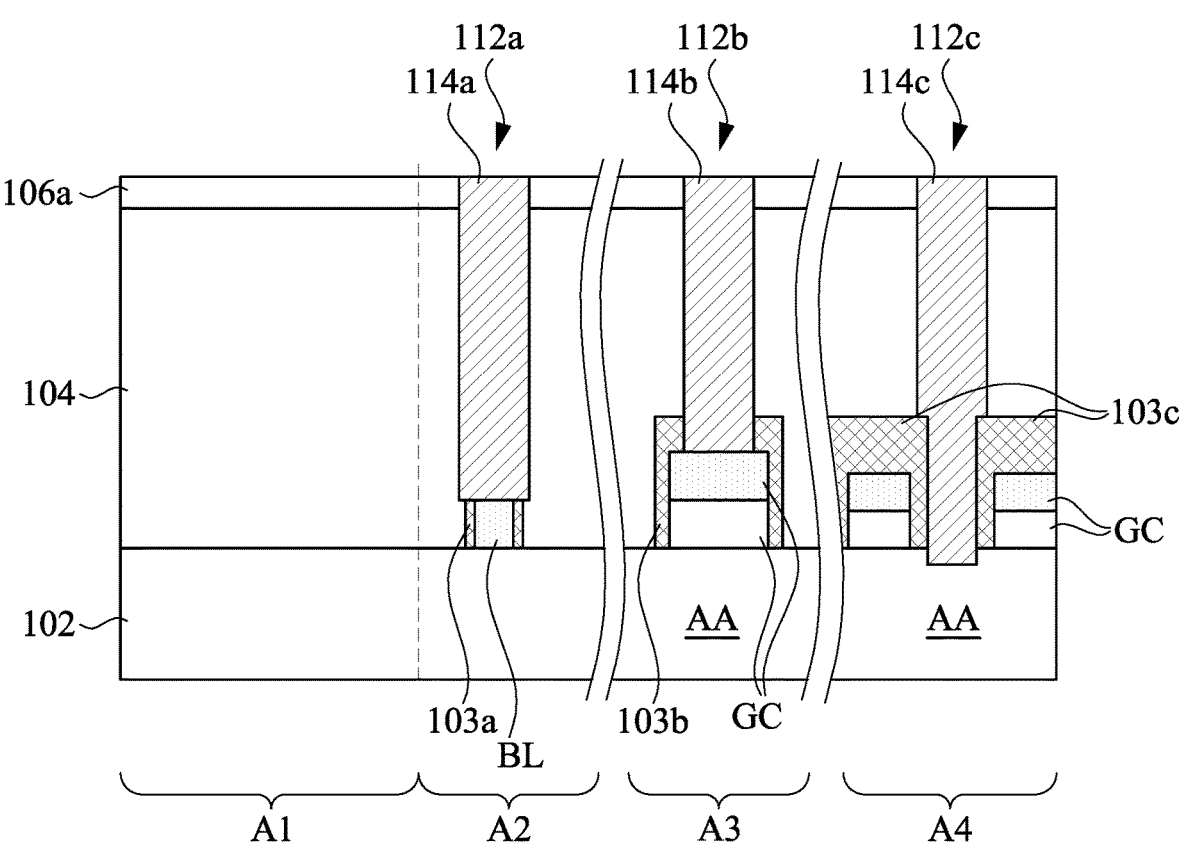

Reference will now be made in detail to the present embodiments of the disclosure, examples of which are illustrated in the accompanying drawings. Wherever possible, the same reference numbers are used in the drawings and the description to refer to the same or like parts.

Reference is made to FIGS. 1-5. FIGS. 1-4 illustrate cross-sectional views of several steps of a semiconductor memory manufacturing process according to some embodiments of the present disclosure, and FIG. 5 illustrates a flowchart of several steps of a semiconductor memory manufacturing process 200 according to some embodiments of the present disclosure. The cross-sectional view illustrates a portion of a memory device 100 including bit line structures and gate structures. A semiconductor substrate 102 is processed to form active areas AA. Several steps are typically involved in semiconductor processing. A suitable semiconductor substrate, such as silicon (Si), is chosen based on the desired device specifications and requirements. A thin layer of silicon dioxide ($SiO_2$) may be on the surface of the substrate. This can be achieved through thermal oxidation, where the substrate is exposed to an oxygen-rich environment at high temperatures, or by using deposition techniques such as chemical vapor deposition (CVD) or plasma-enhanced chemical vapor deposition (PECVD). A layer of photosensitive material, known as photoresist, is coated onto the oxide layer. Then, expose the photoresist to ultraviolet (UV) light through a photomask containing the desired pattern. This step transfers the pattern onto the photoresist. The exposed photoresist is developed using a suitable developer solution. This selectively removes either the exposed (positive photoresist) or unexposed (negative photoresist) regions of the photoresist, leaving behind the desired pattern. An etching process, such as plasma etching or wet etching, is used to selectively remove the exposed oxide layer where the active area will be formed. The patterned photoresist acts as a mask, protecting the regions where the oxide is desired. Ion implantation is performed to introduce p-type or n-type dopant atoms into the exposed semiconductor substrate regions where the active devices will be formed. The dopants modify the electrical properties of the substrate, creating regions with desired conductivity characteristics. The implanted dopants are activated and crystal lattice damage caused by the implantation process is repaired through an annealing process. This step typically involves subjecting the substrate to high temperatures for a specific duration.

In one or more embodiments, the memory device 100 includes a region A1, a region A2, a region A3 and a region A4. The region A1 is a region without patterns (e.g., bit lines or word lines) in a memory array area of a substrate. The region A2 is a region with bit line structures in a memory array area of a substrate. The region A3 is a region with gate structures in a periphery area of the substrate. The region A4 is also a region with gate structures in a periphery area of the substrate.

In step 202 of the process 200, a bit line structure is formed in a memory array area of a substrate (e.g., region A2), wherein the bit line structure includes a bit line metal BL and a bit line mask 103*a*. Forming a bit line structure may involve a series of semiconductor fabrication steps. Apply a layer of photoresist may be applied on top of the active area AA of a substrate. The photoresist can be exposed to ultraviolet light through a photomask. The photomask has a pattern that defines the location of the bit line trench. The photoresist can be developed to remove the exposed or unexposed portions based on the UV light exposure. A chemical etchant may be used to remove the exposed insulating layer, creating openings for the bit line trench. Perform A dry or wet etching process is performed to create the bit line trench where the bit line metal BL and the bit line mask 103*a* will be formed. In one or more embodiments, the bit line metal BL can be tungsten. The bit line metal BL can be formed by an electroplating process. For example, a thin layer of metal, typically tungsten, called the seed layer can be applied at the bottom of the bit line trench. An electroplating process can be used to deposit a thicker layer of tungsten onto the seed layer. This builds up the metal in the trench, forming the desired structure. A chemical mechanical polishing (CMP) may be performed to remove excess metal. The wafer substrate may be subjected to annealing, a heat treatment process, to enhance the properties of the deposited metal and improve its electrical conductivity.

In step 204 of the process 200, gate structures are formed in a periphery area of the substrate (e.g., regions A3, A4), wherein each gate structure includes a gate electrode GC and a gate mask (103*b*, 103*c*). Forming a gate structure may involve a series of semiconductor fabrication steps. Apply a layer of photoresist may be applied on top of the active area AA of a substrate 102. The photoresist can be exposed to ultraviolet light through a photomask. The photomask has a pattern that defines the location of the gate trench. The photoresist can be developed to remove the exposed or unexposed portions based on the UV light exposure. A chemical etchant may be used to remove the exposed insulating layer, creating openings for the gate trench. Perform a dry or wet etching process is performed to create the gate trench where the gate electrode GC and a gate mask (103*b*, 103*c*) will be formed. In one or more embodiments, the gate electrode GC may include a layer of tungsten and a layer of polysilicon as illustrated in FIGS. 1-4. A layer of polysilicon is deposited using techniques like chemical vapor deposition (CVD). The polysilicon layer may be doped to enhance its conductivity. This is typically done by introducing dopant gases during the deposition process. The layer of tungsten (W) may be deposited over the doped polysilicon layer using techniques like chemical vapor deposition (CVD) or physical vapor deposition (PVD). An annealing process is conducted to optimize the properties of the gate electrode GC, ensuring proper crystallinity and electrical characteristics. These steps involve precise control of deposition, doping, and etching processes to achieve the desired gate electrode structure. The combination of tungsten and polysilicon in the gate electrode enhances its conductivity and performance in semiconductor devices. The gate masks (103*b*, 103*c*) are deposited over the gate electrode GC as a gate insulator layer separating the gate electrode GC from the underlying semiconductor material.

In step 206 of the process 200, a dielectric layer 104 is formed over the bit line structure and the gate structures. In one or more embodiments, to form a dielectric layer 104 over the bit line structure and gate structures in semiconductor memory manufacturing, deposition techniques like chemical vapor deposition (CVD) or physical vapor deposition (PVD) are typically utilized. The dielectric material, often silicon oxide, is deposited uniformly across the substrate 102. Subsequently, photolithography and etching processes are employed to define and pattern the dielectric layer according to the desired circuit design. In one or more embodiments, the bit line mask 103a and the dielectric layer 104 are made from different dielectric materials, e.g., silicon nitride and silicon oxide. In one or more embodiments, the gate masks (103b, 103c) and the dielectric layer 104 are made from different dielectric materials, e.g., silicon nitride and silicon oxide.

In step 208 of the process 200, a hard mask layer containing an etch process diagnostic (EPD) signal layer 105 is formed over the dielectric layer 104. This step may include several substeps. A lower hard mask layer 106a is formed over the dielectric layer 104 using a technique like chemical vapor deposition (CVD) or physical vapor deposition (PVD). The EPD signal layer 105 is formed over the lower hard mask layer 106a using a technique like chemical vapor deposition (CVD) or physical vapor deposition (PVD). The EPD signal layer 105 serves as a diagnostic tool for monitoring the etching process. An upper hard mask layer 106b over the EPD signal layer 105 using a technique like chemical vapor deposition (CVD) or physical vapor deposition (PVD). The detailed steps involve precise control of deposition techniques and parameters during each layer formation to ensure uniformity and adherence to the substrate. Additionally, photolithography and etching processes will be applied after each layer deposition to define patterns according to the design specifications. These steps collectively contribute to the creation of a hard mask layer with an embedded etch process diagnostic signal layer in semiconductor memory manufacturing. In one or more embodiments, the EPD signal layer 105, the bit line mask 103a, and the gate masks (103b, 103c) are all made from comprise the same material, i.e., all made from silicon nitride. In one or more embodiments, the lower hard mask layer 106a and the upper hard mask layer 106b can be both made from carbon-based materials.

In step 210 of the process 200 (referring to FIG. 2), a main etching step ME is performed to form a first via hole 112a towards the bit line structure (i.e., the bit line structure is vertically aligned with the first via hole 112a), a second via hole 112b towards one of the gate structures (i.e., the second via hole 112b is vertically aligned with a corresponding gate structure) and a third via hole 112c towards an active area AA (i.e., the active area AA is vertically aligned with the third via hole 112c) of the substrate 102 between immediately-adjacent two of the gate structures until the upper hard mask layer 106b is removed to expose the EPD signal layer 105. Referring to FIG. 1, a photoresist layer 108 can be patterned using a lithography process to locate positions of the first, second and third via holes (112a, 112b, 112c).

Monitoring the etching process using the EPD signal layer 105 typically involves specialized equipment like ellipsometers or spectroscopic reflectometers. The ellipsometer or reflectometer may be calibrated to account for variations in the EPD signal layer 105. An initial measurement of the EPD layer can be taken to establish a baseline before the main etching step ME begins. The ellipsometer or reflectometer is used to measure changes in the EPD signal layer's properties in real-time. This helps track the etching rate and uniformity. In case the EPD signal layer 105, the bit line mask 103a, and the gate masks (103b, 103c) are all made from comprise the same material, i.e., all made from silicon nitride, the ellipsometer or reflectometer will easily measure changes in silicon nitride materials as an etching end point for the main etching step ME.

In step 212 of the process 200 (referring to FIG. 3), an over etching step OE is performed to remove the EPD signal layer 105, to further etch the first via hole 112a to expose the bit line metal BL, to further etch the second via hole 112b to expose the gate electrode GC, and to further etch the third via hole 112c to expose the active area AA. The over etching step OE is performed using time period control. In one or more embodiments, the main etching step ME is performed for a first time period and the over etching step OE is performed for a second time period that is 20%-30% of the first time period. Although the main etching step ME is performed using the EPD signal layer 105 as a diagnostic tool for monitoring the etching process instead of time period control, its etching time period is still measured for determining the time period to perform the over etching step OE.

In step 214 of the process 200 (referring to FIG. 4), conductive materials (e.g., copper) are filled into the first, second and third via holes (112a, 112b, 112c) to form contact vias (114a, 114b, 114c). The contact via 114a is configured to reach the bit line metal BL, the contact via 114b is configured to reach the gate electrode GC, and the contact via 114c is configured to reach the active area AA between immediately-adjacent two of the gate structures.

In one or more embodiments, a barrier layer (e.g., titanium or tantalum) can be coated in the first, second and third via holes (112a, 112b, 112c) to prevent diffusion of the conductive material into the surrounding dielectric. A thin seed layer, typically of copper, can be deposited over the barrier layer to serves as a foundation for the subsequent copper plating. A deposition technique such as electroplating or sputtering can be used to fill the via holes with the desired conductive material, such as copper. After filling the via holes, excess conductive material on the surface can be removed using chemical mechanical polishing (CMP) to ensure a smooth, planar surface.

In sum, the semiconductor memory device manufacturing method disclosed herein utilizes EPD signal layer inserted in hard mask layer to get a strong EPD signal to control main etching/over etching of the dielectric layer etch precisely.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor memory device manufacturing method comprising:

forming a bit line structure in a memory array area of a substrate, wherein the bit line structure comprises a bit line metal and a bit line mask;

forming a gate structure in a periphery area of the substrate, wherein the gate structure comprises a gate electrode and a gate mask;

forming a dielectric layer over the bit line structure and the gate structure;

forming a lower hard mask layer over the dielectric layer;

forming an etch process diagnostic signal layer over the lower hard mask layer;

forming an upper hard mask layer over the etch process diagnostic signal layer; and performing a main etching step to form a first via hole towards the bit line structure and a second via hole towards the gate structure until the upper hard mask layer is removed to expose the etch process diagnostic signal layer.

2. The method of claim 1 further comprising: performing an over etching step to remove the etch process diagnostic signal layer, to further etch the first via hole to expose the bit line metal, and to further etch the second via hole to expose the gate electrode.

3. The method of claim 2, wherein the main etching step is performed for a first time period and the over etching step is performed for a second time period that is 20%-30% of the first time period.

4. The method of claim 1, wherein the etch process diagnostic signal layer, the bit line mask, and the gate mask comprise the same material.

5. The method of claim 4, wherein the etch process diagnostic signal layer, the bit line mask, and the gate mask comprise silicon nitride.

6. The method of claim 1, wherein the bit line mask and the dielectric layer comprise different dielectric materials.

7. The method of claim 1, wherein the gate mask and the dielectric layer comprise different dielectric materials.

8. The method of claim 1, wherein the lower hard mask layer and the upper hard mask layer both comprise carbon-based materials.

9. The method of claim 1, wherein the bit line metal comprises tungsten.

10. The method of claim 1, wherein the gate electrode comprises tungsten and polysilicon.

11. A semiconductor memory device manufacturing method comprising:

forming a bit line structure in a memory array area of a substrate, wherein the bit line structure comprises a bit line metal and a bit line mask;

forming a plurality of gate structures in a periphery area of the substrate, wherein each gate structure comprises a gate electrode and a gate mask;

forming a dielectric layer over the bit line structure and the gate structures;

forming a hard mask layer containing an etch process diagnostic signal layer over the dielectric layer; and performing a main etching step to form a first via hole towards the bit line structure, a second via hole towards one of the gate structures and a third via hole towards an active area of the substrate between immediately-adjacent two of the gate structures until the hard mask layer is partially removed to expose the etch process diagnostic signal layer.

12. The method of claim 11 further comprising: performing an over etching step to remove the etch process diagnostic signal layer, to further etch the first via hole to expose the bit line metal, to further etch the second via hole to expose the gate electrode, and to further etch the third via hole to expose the active area.

13. The method of claim 12, wherein the main etching step is performed for a first time period and the over etching step is performed for a second time period that is 20%-30% of the first time period.

14. The method of claim 11, wherein the etch process diagnostic signal layer, the bit line mask, and the gate mask all comprise the same material.

15. The method of claim 14, wherein the etch process diagnostic signal layer, the bit line mask, and the gate mask all comprise silicon nitride.

16. The method of claim 11, wherein the bit line mask and the gate mask both comprise silicon nitride and the dielectric layer comprises silicon oxide.

17. The method of claim 11, wherein the hard mask layer comprises carbon-based materials.

18. The method of claim 12 further comprising: filling conductive materials into the first, second and third via holes to form contact vias.

19. The method of claim 11, wherein the bit line metal comprises tungsten.

20. The method of claim 11, wherein the gate electrode comprises tungsten and polysilicon.

* * * * *